(12) United States Patent
Perkiö et al.

(10) Patent No.: US 12,237,790 B2
(45) Date of Patent: Feb. 25, 2025

(54) LOW IMPEDANCE SNUBBER CAPACITOR ARRANGEMENT IN A CONVERTER MODULE

(71) Applicant: Vacon Oy, Vaasa (FI)

(72) Inventors: Jani Matti Perkiö, Tampere (FI); Juho Kari, Vaasa (FI)

(73) Assignee: VACON OY, Vaasa (FI)

( * ) Notice: Subject to any disclaimer, the term of this patent is extended or adjusted under 35 U.S.C. 154(b) by 195 days.

(21) Appl. No.: 18/183,278

(22) Filed: Mar. 14, 2023

(65) Prior Publication Data

US 2023/0308039 A1 Sep. 28, 2023

(30) Foreign Application Priority Data

Mar. 24, 2022 (DE) .......................... 102022106988.5

(51) Int. Cl.
*H02P 27/06* (2006.01)
*H05K 1/02* (2006.01)

(52) U.S. Cl.
CPC ........... *H02P 27/06* (2013.01); *H05K 1/0298* (2013.01); *H05K 2201/1009* (2013.01); *H05K 2201/10272* (2013.01)

(58) Field of Classification Search
CPC ........ H02M 7/00; H02M 7/003; H02M 7/125; H02M 7/219; H02M 7/42; H02M 7/5387; H02M 2007/00; H02M 1/346; H02M 7/062; H02M 1/00; H02M 1/348; H02M 1/14; H02P 27/06; H02P 27/04; H02P 9/006; H02P 25/03; H02P 25/062; H02P 29/02; H02P 29/0241; H02P 25/22; H02P 7/06; H02K 11/33; H05K 1/0298; H05K 2201/1009; H05K 2201/10272; H02J 5/00

See application file for complete search history.

(56) References Cited

U.S. PATENT DOCUMENTS

| | | | |
|---|---|---|---|
| 2007/0109715 A1 | 5/2007 | Azuma et al. | |
| 2010/0007293 A1 | 1/2010 | Meodors et al. | |

FOREIGN PATENT DOCUMENTS

| | | | |
|---|---|---|---|
| DE | 20 2017 104 210 U1 | 8/2017 | |
| DE | 10 2017 203 106 A1 | 8/2018 | |
| JP | 2012-152104 A | 8/2012 | |
| JP | 2021065044 A | * 4/2021 | ............ H02M 1/143 |

OTHER PUBLICATIONS

"Matsuda Ryo et al., Motor Drive Device With Smoothing Capacitor and Snubber Capacitor, Apr. 22, 2021, Clarivate Analytics, pp. 1-31." (Year: 2021).*

* cited by examiner

*Primary Examiner* — Antony M Paul
(74) *Attorney, Agent, or Firm* — McCormick, Paulding & Huber PLLC

(57) ABSTRACT

The present disclosure is directed at an AC drive for driving an electric motor. The AC drive has a 3-phase diode bridge, an inverter and a snubber board with multilayer printed circuit board elements, wherein the power lane in every layer of every element is connected to only one potential DC− or DC+, each element includes two capacitors of inverted polarity, wherein each element includes two C-shaped bus bars and wherein the C-shaped bus bars of two neighbouring elements are placed in close proximity to each other.

20 Claims, 7 Drawing Sheets

LOW IMPEDANCE SNUBBER CAPACITOR ARRANGEMENT IN A CONVERTER MODULE

CROSS-REFERENCE TO RELATED APPLICATION

This application claims foreign priority benefits under 35 U.S.C. § 119 from German Patent Application No. 102022106988.5, filed Mar. 24, 2022, the content of which is hereby incorporated by reference in its entirety.

TECHNICAL FIELD

The present invention is directed at a AC drive for driving an electric motor or in e.g. grid converters and/or power converters. The AC drive comprises a 3-phase diode bridge, an inverter and a snubber board with multilayer printed circuit board elements, wherein the power lane in every layer of every element is connected to only one potential DC− or DC+, each element comprises two capacitors of inverted polarity, wherein each element comprises two C-shaped bus bars and wherein the C-shaped bus bars of two neighbouring elements are placed in close proximity to each other.

BACKGROUND

AC drives are prone to snubber voltages occurring at their IGBTs. During such situations, voltages within the drive may rise considerably when IGBTs are switched off. The voltage rise is induced by the inductance between the IGBTs and DC-link capacitors and/or the bus bar of the drive. The voltage rise may lead to problematic behaviour of the drive and/or damage of its components. As drive sizes and their manufacturing costs are reduced, custom snubber capacitor solutions, which could help alleviate the problem, are excluded for cost reasons.

If, alternatively, low cost capacitors are used to overcome this problem, then matching custom made bus bars are required, which in return increase the overall costs of the drive. Additionally, capacitor dimensions of standard capacitors are fixed and usually too large for the presently described AC drives. Therefore, multiple smaller parallel capacitors would have to be used, which decreases the performance of the AC drive through increased inductances of the custom made bus bar solution.

SUMMARY

The aim of the present invention is to provide an improved AC drive, which overcomes these problems. This aim is achieved by a AC drive according to claim 1. Preferable embodiments of the invention are subject of the dependent claims.

According to the invention, a AC drive for driving an electric motor is provided. The drive comprises a 3-phase diode bridge, an inverter and a snubber board with multilayer printed circuit board elements, wherein the power lane in every layer of every element is connected to only one potential DC− or DC+ and each element comprises two capacitors of inverted polarity. Each element comprises two C-shaped bus bars wherein the C-shaped bus bars of two neighbouring elements are placed in close proximity to each other. The C-shaped bus bars may not be limited to being C-shaped but may be any shape e.g. I, L-shape.

The multilayer printed circuit board elements may be understood to comprise the bus bars. Alternatively, it is possible to regard the bus bars as components, which are separate from the multilayer printed circuit board elements. The close proximity of the bus bars may be understood as the bus bars being separated only by one component, such as an insulator, while being in close contact with said component.

The present invention uses a multilayer PCB with snubber capacitors, providing a low inductance path to the IGBTs or other active components of the drive. The pathway from the PCBA to the IGBTs is implemented with a low inductance design, wherein the DC+ and DC− bus bars are mechanically connected as close as possible to each other. Additionally, they have a large and flat area between them. This is facilitated by the large and flat middle section of the C-shaped bus bars.

The presently described drive provides a solution, which yields a very low inductance circuit for the snubber capacitors and therefore reduced IGBT snubber voltages. The presently described drive offers a cheaper solution compared to the above-mentioned known alternative solutions. Its manufacturing quality is enhanced at it can be easily assembled in automated assembly processes.

In a preferred embodiment of the invention, an insulator is provided between the C-shaped bus bars of two neighbouring elements and the C-shaped bus bars are spaced apart from each other by the thickness of the insulator. The insulator may be aligned in parallel to the middle section of the C-shaped bus bars. It may be glued or otherwise connected to the C-shaped bus bars. The distance between the two bus bars may therefore be slightly larger than the thickness of the insulator.

In another preferred embodiment of the invention, middle sections of adjacent C-shaped bus bars are in close contact with the insulators. The middle sections may be glued or otherwise connected to the insulator.

In another preferred embodiment of the invention, five multilayer printed circuit board elements are provided. The number of multilayer printed circuit board elements may be freely selected to provide the required characteristics to the drive. The multilayer printed circuit board elements may be identical to each other.

In another preferred embodiment of the invention, the multilayer printed circuit board elements comprise layers that are alternatingly connected to DC+ and DC−, wherein the layers are separated from each other by air gaps and/or PCB core material and/or prepregs.

In another preferred embodiment of the invention, the multilayer printed circuit board elements comprise a top layer connected to DC−, a second layer connected to DC+, a third layer connected to DC− and a bottom layer connected to DC+. Accordingly, there may be two groups of layers, one connected to DC+, the other one connected to DC−. The layers of one group may not overlap across their entire layers surface. The non-overlapping areas of the layers may be used for connecting the layers to either DC+ or DC−. The layers may be separated from each other by air gaps and/or PCB core material and/or prepregs.

In another preferred embodiment of the invention, the C-shaped bus bars are connected to the elements via screws and/or spacers, preferably SMD spacers and/or nuts, and/or through holes. The nuts may be hexagonal nuts.

In another preferred embodiment of the invention, the snubber board is installed directly to IGBT DC+ and DC− terminals of the drive.

In another preferred embodiment of the invention, the C-shaped bus bars are provided on one side of the snubber board and the capacitors are provided on the opposite side of the snubber board.

In another preferred embodiment, the multilayer printed circuit board elements are mounted behind a high current bus bar with a sufficient clearance to avoid voltage arching.

In another preferred embodiment, the multi-layer printed circuit board elements are mounted behind a high current bus bar and comprise a low impedance path for electrical current to flow between the capacitors and the high current bus bar.

BRIEF DESCRIPTION OF THE DRAWINGS

Further details and advantages of the invention will be described with reference to the figures. The figures show.

DETAILED DESCRIPTION

Figure 1:
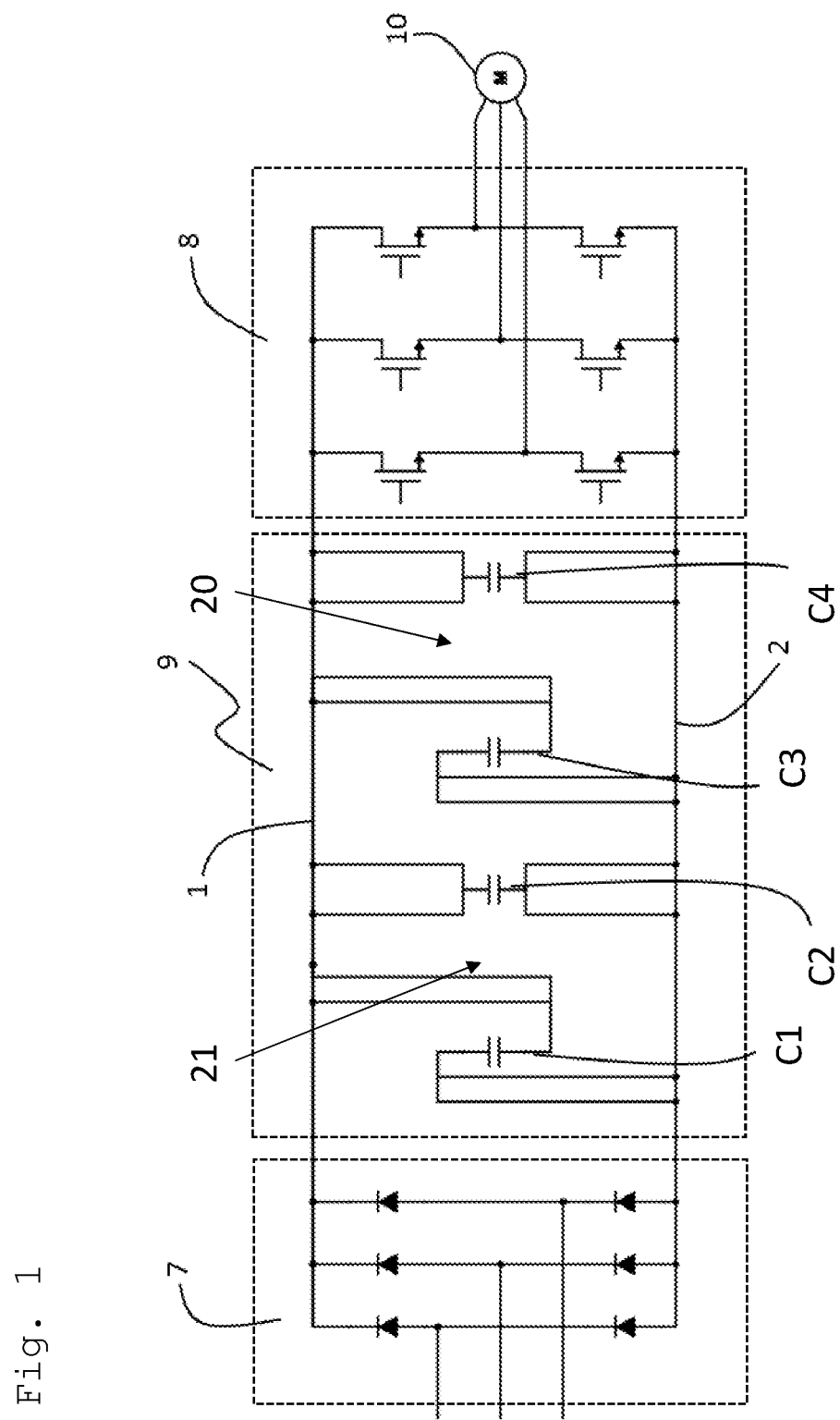
FIG. 1: a circuit diagram of the AC drive.

FIG. 1 shows an embodiment of the a circuit diagram of the AC drive according to the present invention. The drive is provided for driving an electric motor, in particular a 3-phase electric motor 10. The drive comprises a 3-phase diode bridge 7, an inverter 8 and a snubber board 9 with multilayer printed circuit board elements 20, 21. The multilayer printed circuit board elements 20, 21 will be shown in more detail in FIGS. 3 and 4. The 3-phase diode bridge 7 may be an active front end and the inverter 8 may be a 3-phase IGBT inverter.

The power lane in every layer of every multilayer printed circuit board element 20, 21 is connected to only one potential DC− 1 or DC+ 2 and each element 20, 21 comprises two capacitors C1-C10 of inverted polarity.

In the embodiment of FIG. 1, only two pairs of capacitors C1-C4 are shown wherein the pair of first and second capacitors C1, C2 and the pair of third and fourth capacitors C3, C4 have switched polarity with respect to each other. The capacitors C1-C4 of the snubber board 9 function as snubber capacitors of the drive.

Figure 2:
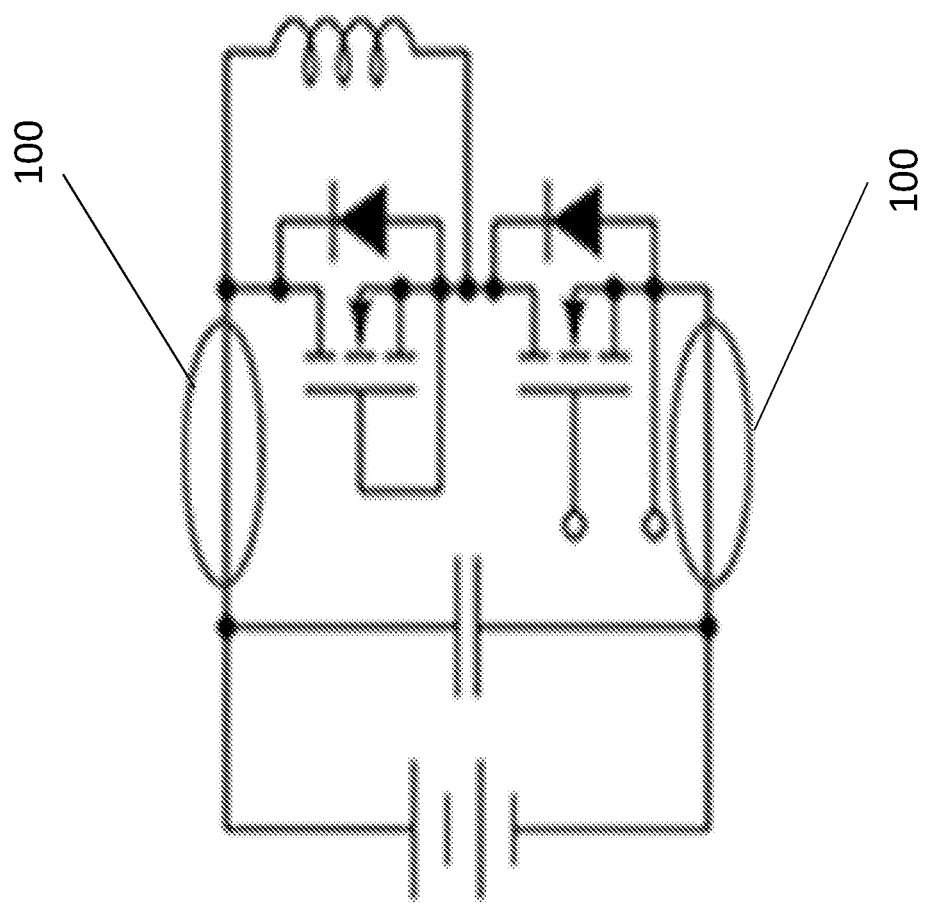
FIG. 2: a circuit diagram showing a snubber capacitor.

FIG. 2 shows a circuit diagram with a snubber capacitor. A snubber capacitor is a capacitor that is connected to a large-current switching node for the purpose of reducing the parasitic inductance of electric wiring. Parasitic inductance causes large surges at switch-off, i.e. when the current is blocked. When such surges exceed component ratings, said components may be destroyed as a consequence. In order to reduce parasitic wiring inductance, capacitors must be connected near the areas indicated by reference sign 100 in FIG. 2.

Figure 3:
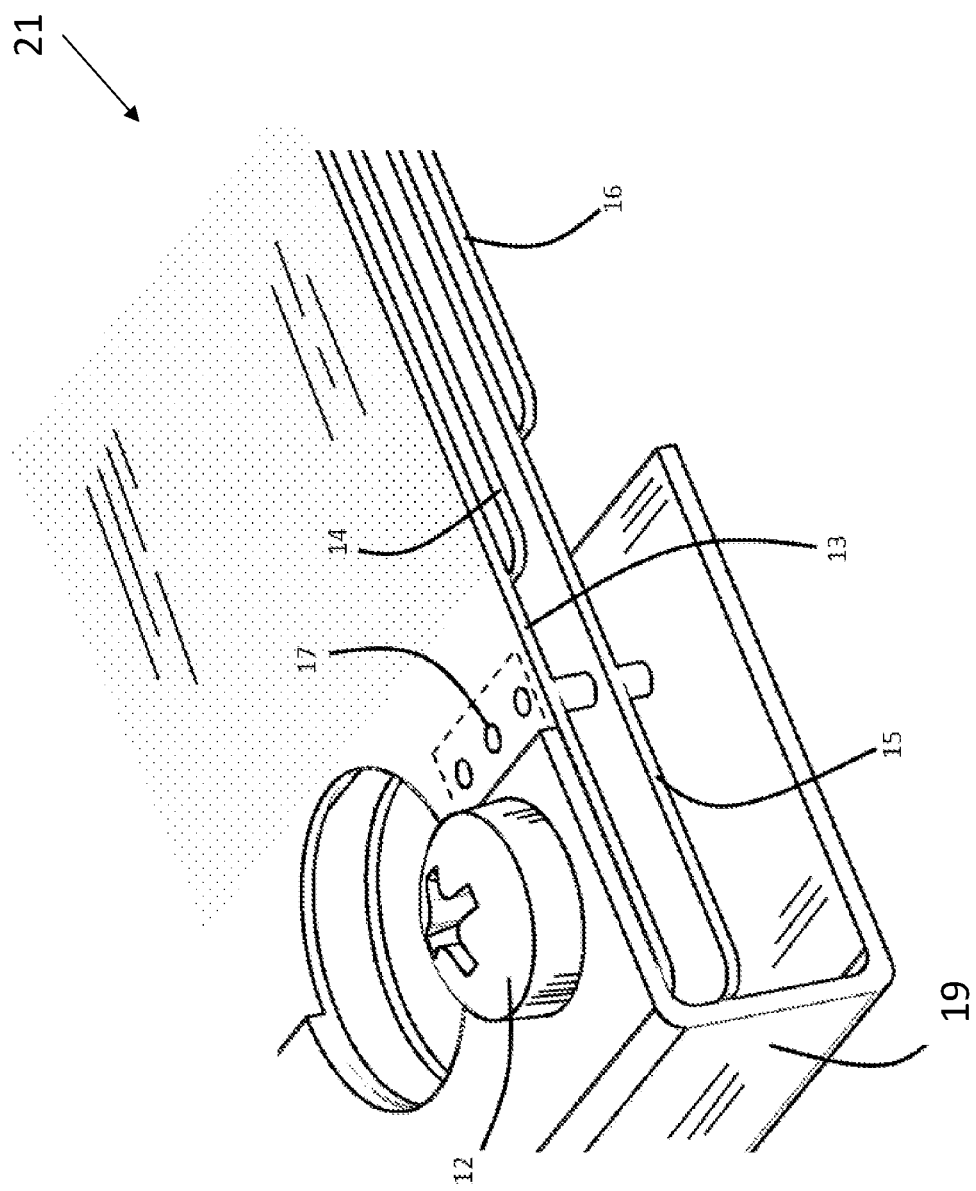
FIG. 3: a detailed view of the connection between the C-shaped bus bars and the multilayer printed circuit board element.

FIG. 3 is a detailed view of the connection between the C-shaped bus bar 19 and the multilayer printed circuit board element 21, shown as a cupper layer build-up. As will be shown in the following figures, each multilayer printed circuit board element 20, 21 may be provided between two separated bus bars 18, 19. Each of these two separated bus bars 18, 19 is connected to either DC− or DC+.

Although only one multilayer printed circuit board element 21 is shown in FIG. 3, the remainder of the multilayer printed circuit board elements 20, 21 may be of similar or identical architecture. Reference number 13 refers to the top layer of the element 21, which is connected to DC−. Reference number 14 refers to a second layer, which is connected to DC+. Reference number 15 refers to a third layer, which is connected to DC−. Reference number 16 refers to a bottom layer, which is connected to DC+. Screws 12 may be provided for electrically connecting either the top layer 13 or the bottom layer 16 to the bus bar 19.

An electric connection between every other layer may be provided by means of through holes 17 and correspondingly placed conductors. In order to facilitate the electric connection of every other layer, the extension, in particular in a longitudinal direction of the snubber board 9, of adjacent layers such as the top layer 13 and the second layer 14 may be chosen such that they do not overlap over their entire lengths and/or surface areas.

In the embodiment of FIG. 3, the top layer 13 and the third layer 15 extend all the way towards the bus bar 19, whereas the bottom layer 16 and the second layer 14 are shorter and do not extend all the way towards the bus bar 19. Therefore, the second layer 14 and the bottom layer 16 do not interfere with the electric connection between the top layer 13, the third layer 15 and one of the bus bars 19. The bottom layer 16 and the second layer 14 may extend all the way towards the other bus bar 18 opposite bus bar 19, wherein the other bus bar 18 is not shown in FIG. 3.

In the embodiment of FIG. 3, the multilayer printed circuit board element 21 comprises the top layer 13 connected to DC−, i.e. the bus bar 19. The second layer 14 is connected to DC+, i.e. to a bus bar 18 opposite bus bar 19 and not shown in FIG. 3. The third layer 15 is again connected to DC− and therefore the same bus bar 19 as the top layer 13 via through holes 17 and a corresponding conductive portion. The bottom layer 16 is again connected to DC+.

If more than four layers are used in the multilayer printed circuit board elements 20, 21, then the additional layers may also be connected to alternating bus bars 18, 19. Accordingly, there may be two groups of layers, one connected to DC+ 2, the other one connected to DC− 1. The layers of one group may not overlap across their entire layer surface. The non-overlapping areas of the layers may be used for connecting the layers to either DC+ 2 or DC− 1.

The bottom layer 16, or more generally, the bottom-most layers of the multilayer printed circuit board elements 20, 21 may extend the least in a direction perpendicular to the bus bars 18, 19. Additionally or alternatively, the upper layers may extend further in said direction than the lower layers of the multilayer printed circuit board elements 20, 21. Going from the top layer 13 towards the bottom layer 16, each layer in a pair of adjacent layers may be of equal or similar length in the direction perpendicular to the bus bars 18, 19. The top pair of layers may be of greatest length and the bottom pair of layers may be of smallest length in the direction perpendicular to the bus bars 18, 19. Intermediate pairs of layers may be of intermediate length in the direction perpendicular to the bus bars 18, 19 and with respect to the top and bottom pair of layers.

The slightly deviating geometries of the layers of the multilayer printed circuit board elements 20, 21 make it possible to easily provide layers that are alternatingly connected to DC+ and DC− or rather the corresponding bus bars 18, 19. According to the embodiment of FIG. 3, the individual layers may be separated from each other by air gaps. Alternatively or additionally, PCB core material and/or prepregs may be provided between the layers.

The bus bar 19 and/or the multilayer printed circuit board element 21 may comprise a circular or partially circular hole or recess. Said holes and/or recesses may overlap at least partially for e.g. providing space for tools and/or components.

Figure 4:
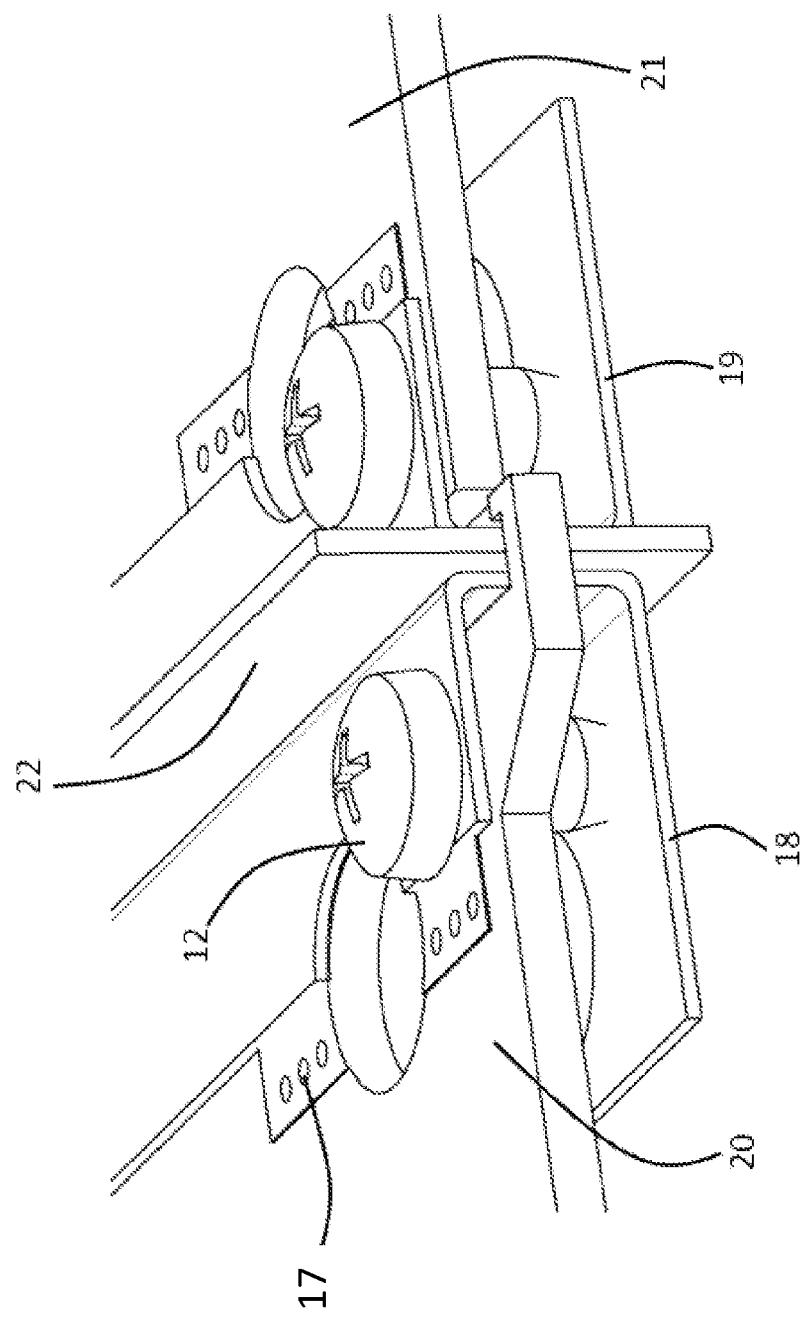
FIG. 4: a detailed view of the insulator between the C-shaped bus bars.

FIG. 4 is a detailed view of the insulator 22 between the C-shaped bus bars 18, 19. Although C-shaped bus bars 18, 19 are shown here, bus bars 18, 19 of any shape may be combined with a corresponding insulator 22. The two bus bars 18, 19 partially enclose their corresponding multilayer printed circuit board element 20, 21 in a direction perpendicular to the surface of the multilayer printed circuit board elements 20, 21. The insulator 22 may be oriented in a direction perpendicular to the surface of the multilayer printed circuit board element 20, 21. The surface of the multilayer printed circuit board element 20, 21 may be understood as the flat side of the elements 20, 21.

The insulator 22 may be of the same or similar length as the two bus bars 18, 19. The vertical direction of the insulator 22 may correspond to the direction of the screw 12. The insulator 22 may extend further in its vertical direction than the screw 12 and/or the two bus bars 18, 19.

Each of the multilayer printed circuit board elements 20, 21 may comprise two C-shaped bus bars 18, 19 or bus bars of any other suitable shape. Two bus bars 18, 19 of two neighbouring elements 20, 21 may be placed in close proximity to each other and may be preferably arranged in symmetry to one another.

Two neighbouring C-shaped bus bars 18, 19 are spaced apart from each other by the thickness of the insulator 22. The insulator 22 may be aligned in parallel to the middle sections of the C-shaped bus bars 18, 19. Both, the insulator 22 and the middle section of the C-shaped bus bars may be planar. The insulator 22 may be glued or otherwise connected to the C-shaped bus bars 18, 19.

In the embodiment of FIG. 4, only the middle sections of adjacent C-shaped bus bars 18, 19 are in close contact with the insulator 22. The middle sections of the C-shaped bus bars 18, 19 may extend e.g. half as far in the vertical direction of the bus bars 18, 19 as the insulator 22.

The C-shaped bus bars 18, 19 are connected to the elements 20, 21 via screws 12. Additional or alternative spacers may be provided for connecting the elements 20, 21 to the bus bars 18, 19. For example, SMD spacers may be provided between the parallel end-portions of the C-shaped bus bars 18, 19. Additionally or alternatively, one or more nuts such as hexagonal nuts may be provided. The nuts may be screwed to the screw 12 such that the parallel end-portions of the bus bars 18, 19 are compressed by the screw head on the one side and the nut on the other side. Alternatively, only one of the end-portions of the C-shaped bus bars 18, 19 may be positioned between the screw head and the nut.

Through holes 17 may be provided in the layers of the multilayer printed circuit board elements 20, 21 for facilitating an electric connection between alternating layers of the multilayer printed circuit board elements 20, 21.

Figure 5:
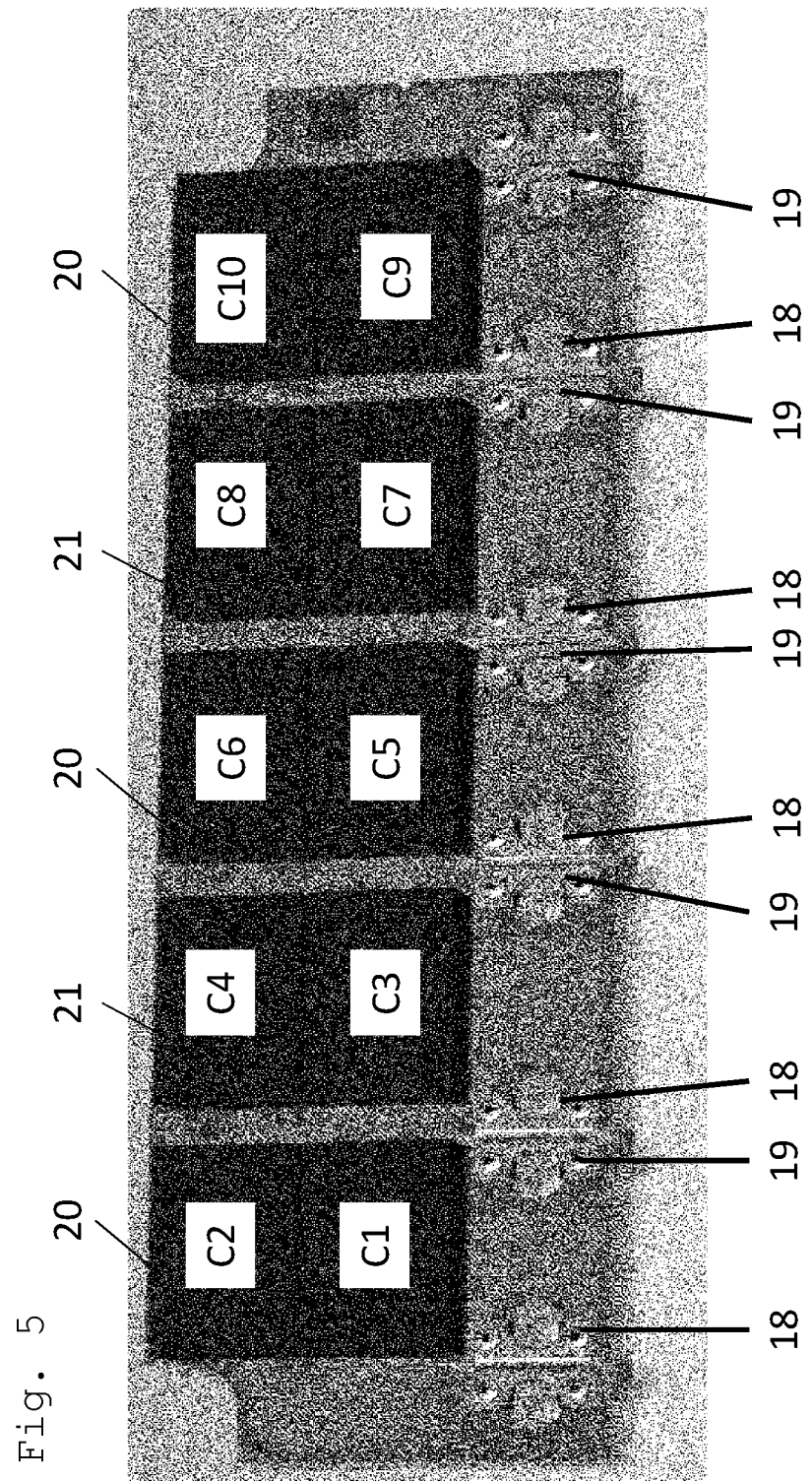
FIG. 5: a detailed view of the snubber board.

FIG. 5 is a detailed view of the snubber board 9. Its PCBA may consist of ten 750 nF capacitors C1-C10 connected in parallel in a 4-layer PWB. The power plane in every layer is connected only to one potential DC− 1 or DC+ 2. In the presently described example and as shown in FIG. 3, the top layer 13 may be connected to DC− 1, the second layer 14 to DC+ 2, the third layer 15 to DC− 1 and the bottom layer 16 to DC+ 2. The snubber board 9 may be installed directly to the IGBT DC+ and DC− terminals. Every second capacitor polarity is inverted for reduced mutual inductance. The C-shaped bus bars 18, 19 are placed as close as possible to each other. The bus bars 18, 19 may be connected to the PWB with screws via SMD spacers. The insulator 22 is placed between bus bars 19, 19 as shown in FIG. 4.

The embodiment of FIG. 5 shows five multilayer printed circuit board elements 20, 21. The number of multilayer printed circuit board elements 20, 21 may vary according to the total required capacitance of the drive.

The C-shaped bus bars 18, 19 are provided on one side of the snubber board 9 and the capacitors C1-C10 are provided on the opposite side of the snubber board 9. The snubber board 9 may be installed directly to IGBT DC+ and DC− terminals of the drive.

Figure 6:
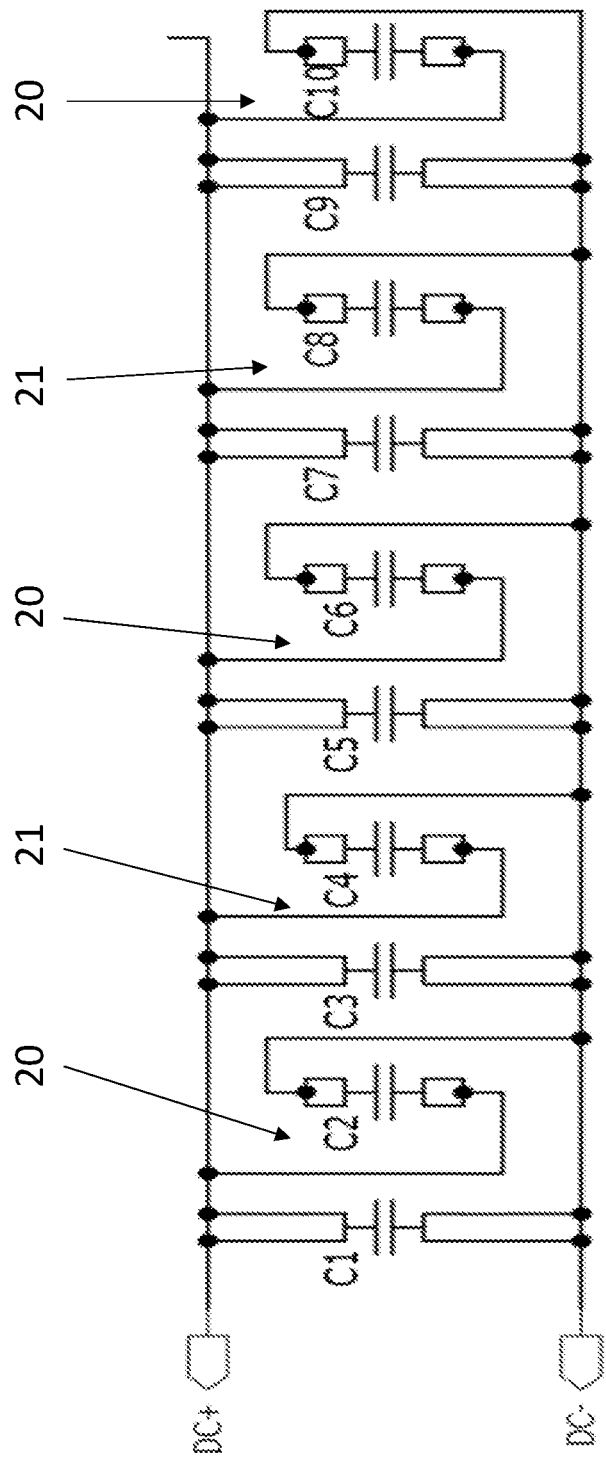
FIG. 6: a circuit diagram of the snubber board.

FIG. 6 shows a circuit diagram of the snubber board of FIG. 5. Each pair of capacitors C1-C10 is part of a multilayer printed circuit board element 20, 21.

Figure 7:
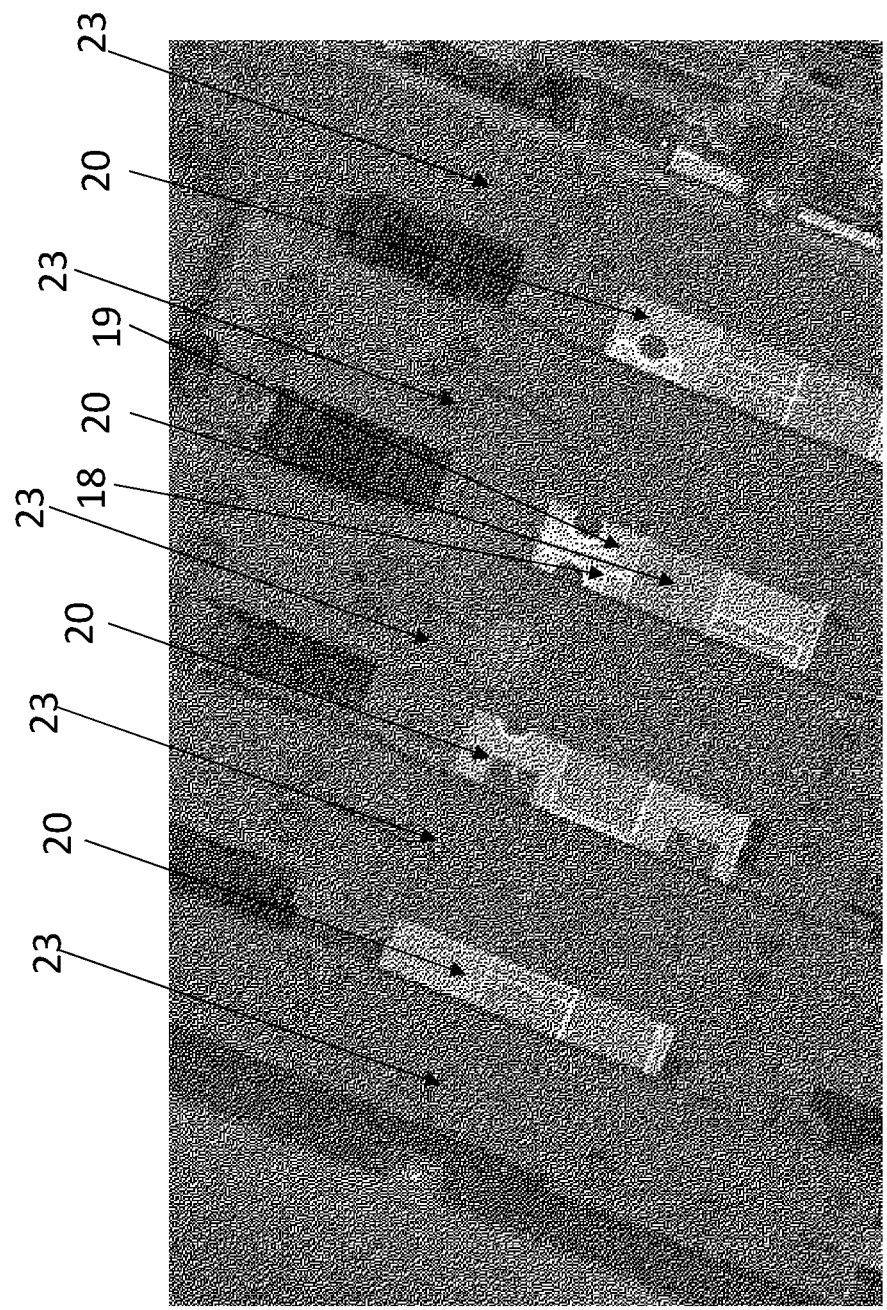
FIG. 7: a view of the multilayer printed circuit board element behind the high current bus bars.

FIG. 7 shows the multilayer printed circuit board elements 20, 21 behind high current bus bars 23. The height of the multilayer printed circuit board elements 20, 21 is kept low to ensure sufficient free space between the components screws 12, capacitors C1-C10, and C-shaped bus bars 18, 19 of the multilayer printed circuit board elements 20, 21 and the high current bus bar 23. The minimum distance may be defined to avoid high voltage arching between the components screws 12, capacitors C1-C10, and C-shaped bus bars 18, 19 of the multilayer printed circuit board element 20, 21 and the high current bus bar 23. The capacitors C1-C10 may have a low height to support the clearance between capacitors C1-C10 and the high current bus bar 23.

The low height or profile of the multilayer printed circuit board elements 20, 21 with components screws 12, capacitors C1-C10, and C-shaped bus bars 18, 19 make it possible to locate them behind the high current bus bars 23.

By placing the multilayer printed circuit board elements 20, 21 behind the high current bus bar 23, less space is required inside the drive compared to a design having one area with high current bus bars 23 and another area with the multilayer printed circuit board elements 20, 21. The very short distance between the multilayer printed circuit board element 20, 21 and the high current bus bar 23 make the snubber capacitors C1-C10 very effective because of the low impedance path to conduct current.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. An AC drive for driving an electric motor, comprising a 3-phase diode bridge, an inverter and a snubber board with multilayer printed circuit board elements, wherein the power lane in every layer of every element is connected to only one potential DC− or DC+, each element comprises two capacitors of inverted polarity, wherein each element comprises two C-shaped bus bars and wherein the C-shaped bus bars of two neighbouring elements are placed in close proximity to each other.

2. The AC drive according to claim 1, wherein an insulator is provided between the C-shaped bus bars of two neighbouring elements and that the C-shaped bus bars are spaced apart from each other by the thickness of the insulator.

3. The AC drive according to claim 2, wherein middle sections of adjacent C-shaped bus bars are in close contact with the insulators.

4. The AC drive according to claim 3, wherein five multilayer printed circuit board elements are provided.

5. The AC drive according to claim 3, wherein the multilayer printed circuit board elements comprise layers that are alternatingly connected to DC+ and DC−, wherein the layers are separated from each other by air gaps and/or PCB core material and/or prepregs.

6. The AC drive according to claim 3, wherein the multilayer printed circuit board elements comprise a top layer connected to DC−, a second layer connected to DC+, a third layer connected to DC− and a bottom layer connected to DC+.

7. The AC drive according to claim 2, wherein five multilayer printed circuit board elements are provided.

8. The AC drive according to claim 2, wherein the multilayer printed circuit board elements comprise layers that are alternatingly connected to DC+ and DC−, wherein the layers are separated from each other by air gaps and/or PCB core material and/or prepregs.

9. The AC drive according to claim 2, wherein the multilayer printed circuit board elements comprise a top layer connected to DC−, a second layer connected to DC+, a third layer connected to DC− and a bottom layer connected to DC+.

10. The AC drive according to claim 1, wherein five multilayer printed circuit board elements are provided.

11. The AC drive according to claim 10, wherein the multilayer printed circuit board elements comprise layers that are alternatingly connected to DC+ and DC−, wherein the layers are separated from each other by air gaps and/or PCB core material and/or prepregs.

12. The AC drive according to claim 10, wherein the multilayer printed circuit board elements comprise a top layer connected to DC−, a second layer connected to DC+, a third layer connected to DC− and a bottom layer connected to DC+.

13. The AC drive according to claim 1, wherein the multilayer printed circuit board elements comprise layers that are alternatingly connected to DC+ and DC−, wherein the layers are separated from each other by air gaps and/or PCB core material and/or prepregs.

14. The AC drive according to claim 13, wherein the multilayer printed circuit board elements comprise a top layer connected to DC−, a second layer connected to DC+, a third layer connected to DC− and a bottom layer connected to DC+.

15. The AC drive according to claim 1, wherein the multilayer printed circuit board elements comprise a top layer connected to DC−, a second layer connected to DC+, a third layer connected to DC− and a bottom layer connected to DC+.

16. The AC drive according to claim 1, wherein the C-shaped bus bars are connected to the elements via screws and/or spacers, preferably SMD spacers and/or nuts, and/or through holes.

17. The AC drive according to claim 1, wherein the snubber board is installed directly to IGBT DC+ and DC− terminals of the drive.

18. The AC drive according to claim 1, wherein the C-shaped bus bars are provided on one side of the snubber board and the capacitors are provided on the opposite side of the snubber board.

19. The AC drive according to claim 1, wherein the multilayer printed circuit board elements are mounted behind a high current bus bar with a sufficient clearance to avoid voltage arching.

20. The AC drive according to claim 1, wherein the multi-layer printed circuit board elements are mounted behind the high current bus bar and comprise a low impedance path for electrical current to flow between the capacitors and the high current bus bar.

* * * * *